(12) United States Patent
Jo

(10) Patent No.: US 7,660,170 B2
(45) Date of Patent: Feb. 9, 2010

(54) METHODS OF OPERATING NON-VOLATILE MEMORY DEVICES TO GENERATE DATA STROBE SIGNALS DURING DATA READING AND RELATED DEVICES

(75) Inventor: Nam-Phil Jo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 11/565,351

(22) Filed: Nov. 30, 2006

(65) Prior Publication Data

US 2008/0101138 A1    May 1, 2008

(30) Foreign Application Priority Data

Oct. 31, 2006    (KR) ..................... 10-2006-0106184

(51) Int. Cl.
*G11C 7/00* (2006.01)
(52) U.S. Cl. ................... 365/193; 365/233; 365/189.05
(58) Field of Classification Search ................. 365/193, 365/233, 189.05
See application file for complete search history.

(56) References Cited

U.S. PATENT DOCUMENTS

| | | | |
|---|---|---|---|
| 6,266,273 B1 * | 7/2001 | Conley et al. .......... | 365/185.11 |
| 6,466,491 B2 * | 10/2002 | Yanagawa .................. | 365/194 |
| 6,498,766 B2 * | 12/2002 | Lee et al. ................ | 365/189.15 |
| 6,564,285 B1 | 5/2003 | Mills et al. | |
| 6,671,211 B2 * | 12/2003 | Borkenhagen et al. . | 365/189.05 |
| 6,728,144 B2 * | 4/2004 | Nygren ........................ | 365/193 |
| 7,058,776 B2 * | 6/2006 | Lee ............................. | 711/167 |
| 7,180,800 B2 * | 2/2007 | Kim ........................... | 365/193 |
| 7,366,029 B2 * | 4/2008 | Kagan .................... | 365/185.33 |
| 7,443,741 B2 * | 10/2008 | Butt et al. ................... | 365/193 |
| 2006/0077730 A1 | 4/2006 | Jakobs et al. | |
| 2007/0291557 A1 * | 12/2007 | Nishio et al. ................ | 365/193 |
| 2008/0034142 A1 * | 2/2008 | Jo et al. ...................... | 710/301 |

FOREIGN PATENT DOCUMENTS

| | | |
|---|---|---|
| JP | 07-036825 | 2/1995 |
| JP | 2001-126481 | 5/2001 |

* cited by examiner

*Primary Examiner*—Connie C Yoha
(74) *Attorney, Agent, or Firm*—Myers Bigel Sibley & Sajovec, P.A.

(57) ABSTRACT

A non-volatile memory device includes a latch unit, a non-volatile memory cell array configured to store data, and a control unit. The control unit is configured to receive a read command and a read address output from a memory controller, generate a data strobe signal based on the received read command, read data corresponding to the received read address from the non-volatile memory cell array, and output the read data to the latch unit. The latch unit is configured to output the data output from the control unit to the memory controller in response to the data strobe signal. Related methods of operation are also discussed.

23 Claims, 6 Drawing Sheets

METHODS OF OPERATING NON-VOLATILE MEMORY DEVICES TO GENERATE DATA STROBE SIGNALS DURING DATA READING AND RELATED DEVICES

CROSS-REFERENCE TO RELATED APPLICATIONS

This application claims priority under 35 U.S.C. §119 from Korean Patent Application No. 10-2006-0106184, filed on Oct. 31, 2006, the disclosure of which is hereby incorporated by reference herein in its entirety.

FIELD OF THE INVENTION

The present invention relates to integrated circuit devices, and more particularly, to non-volatile memory devices and related methods of operation.

BACKGROUND OF THE INVENTION

FIG. 1 is a timing diagram of a read operation of a conventional non-volatile memory device. That is, FIG. 1 shows the timing of a read operation performed by a non-volatile memory device (not shown) in response to a read enable signal /RE output from a memory controller (not shown).

As shown in FIG. 1, the memory controller may receive data DATA[7:0] within each cycle of the read enable signal /RE when the data DATA[7:0] is output from the non-volatile memory device. When the non-volatile memory device outputs the data DATA[7:0] for each read cycle time tRC of the non-volatile memory device, the read/write performance of the non-volatile memory device can be maximized (which may be referred to as "1-cycle access" of the memory controller). In other words, when 1-cycle access is used, the non-volatile memory device may operate at maximum performance. According to a data sheet of specification data provided by Samsung Electronics Co., Ltd. (http://www.sec.co.kr), "tREA" may indicate a /RE access time, "tRHZ" may indicate a /RE high to output Hi-Z, and "tREH" may indicate a /RE high hold time.

The non-volatile memory device may output the data DATA[7:0] based on the read enable signal /RE. However, as the read cycle time tRC is gradually decreased (for example, to less than 25 nanoseconds), the memory controller may be unable to perform 1-cycle access. More particularly, when the read cycle time tRC is gradually decreased, the data set-up time margin and the data hold time margin may be decreased, for example, due to switching noise generated by pins related to data input/output, jitter of the read enable signal /RE used as a clock signal for outputting data, impedance of a printed circuit board (PCB), and/or delay(s) associated with a data input/output bus.

SUMMARY OF THE INVENTION

According to some embodiments of the present invention, a method for generating a data strobe signal in a non-volatile memory device may include receiving a read command output from a memory controller, generating the data strobe signal to latch data responsive to receiving the read command, and outputting the generated data strobe signal to the memory controller. The non-volatile memory device may be a flash EEPROM. For example, the flash EEPROM may be an SLC (single level cell) and/or an MLC (multi-level cell).

According to other embodiments of the present invention, a method for processing data between a non-volatile memory device and a memory controller may include receiving a read command and a read address output from the memory controller, generating a data strobe signal in response to the received read command, and outputting data corresponding to the read address from a non-volatile memory cell array to the memory controller along with the data strobe signal responsive to generating the data strobe signal.

In some embodiments, outputting the data corresponding to the read address to the memory controller with the data strobe signal may include generating the data strobe signal at a control unit of the non-volatile memory device in response to the received read command, outputting the generated data strobe signal to the memory controller, reading the data corresponding to the read address from the non-volatile memory cell array, and outputting the read data to a latch unit. In addition, data output from the control unit may be latched by a latch unit, and the latched data may be output to the memory controller.

In other embodiments, the method may further include latching, by the memory controller, the latched data output from the non-volatile memory device in response to the data strobe signal.

In some embodiments, the method may include latching, by the memory controller, the data corresponding to the read address in response to the data strobe signal within a cycle of the data strobe signal after the data corresponding to the read address is output from the non-volatile memory device.

According to still other embodiments of the present invention, a non-volatile memory device may include a latch unit, a non-volatile memory cell array configured to store data, and a control unit configured to receive a read command and a read address output from a memory controller, generate a data strobe signal based on the received read command, read data corresponding to the received read address from the non-volatile memory cell array, and output the read data to the latch unit. The latch unit may be configured to output the data that is output from the control unit to the memory controller in response to the data strobe signal.

In some embodiments, the latch unit may include a plurality of flip-flops. The plurality of flip-flops may be configured to latche the data output from the control unit and output the latched data to the memory controller in response to the data strobe signal.

In other embodiments, the non-volatile memory device may further include an output pin. The control unit may be configured to output the data strobe signal to the memory controller via the output pin.

In some embodiments, the control unit may include a controller configured to receive the read command and the read address, generate a control signal based on the received read command, read the data corresponding to the received read address from the non-volatile memory cell array, and output the read data to the latch unit. The control unit may further include a signal generator configured to generate the data strobe signal in response to the control signal.

According to further embodiments of the present invention, a memory system may include a non-volatile memory device and a memory controller. The non-volatile memory device may include a first latch unit, a non-volatile memory cell array configured to store data, and a control unit configured to receive a read command and a read address output from the memory controller, generate a data strobe signal based on the received read command, read data corresponding to the received read address from the non-volatile memory cell array, and output the read data to the first latch unit. The first latch unit may be configured to output the data that is output from the control unit to the memory controller in response to the data strobe signal and, the control unit may be configured to output the data strobe signal to the memory controller.

In some embodiments, the first latch unit may include a plurality of flip-flops. The plurality of flip-flops may be configured to latch the data output from the control unit and output the latched data to the memory controller in response to the data strobe signal.

In other embodiments, the control unit may include a controller configured to receive the read command and the read address, generate a control signal based on the received read command, read the data corresponding to the received read address from the non-volatile memory cell array, and output the read data to the first latch unit. The control unit may further include a signal generator configured to generate the data strobe signal in response to the control signal.

In some embodiments, the memory controller may include an internal circuit configured to output the read command and the read address, and a second latch unit configured to receive data output from the first latch unit in response to the data strobe signal output from the control unit of the non-volatile memory device.

In other embodiments, the second latch unit may include a plurality of flip-flops. The plurality of flip-flops of the second latch unit may be configured to latch the data output from the first latch unit in response to the data strobe signal.

In some embodiments, the memory system may be a memory card.

DETAILED DESCRIPTION OF EMBODIMENTS OF THE INVENTION

Figure 1:
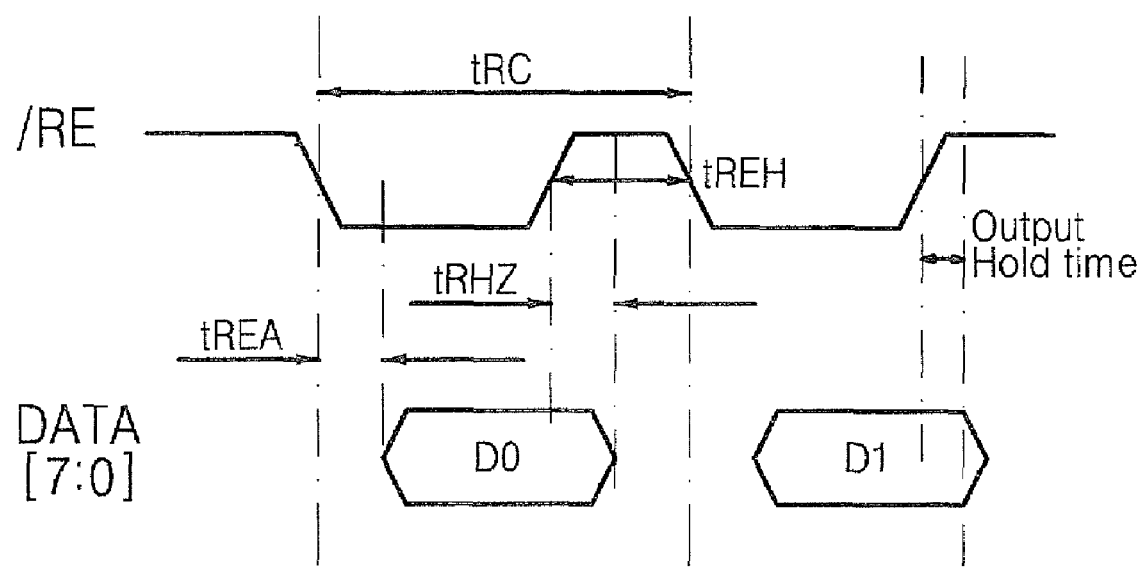
FIG. 1 is a timing diagram of the read operation of a conventional non-volatile memory device.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
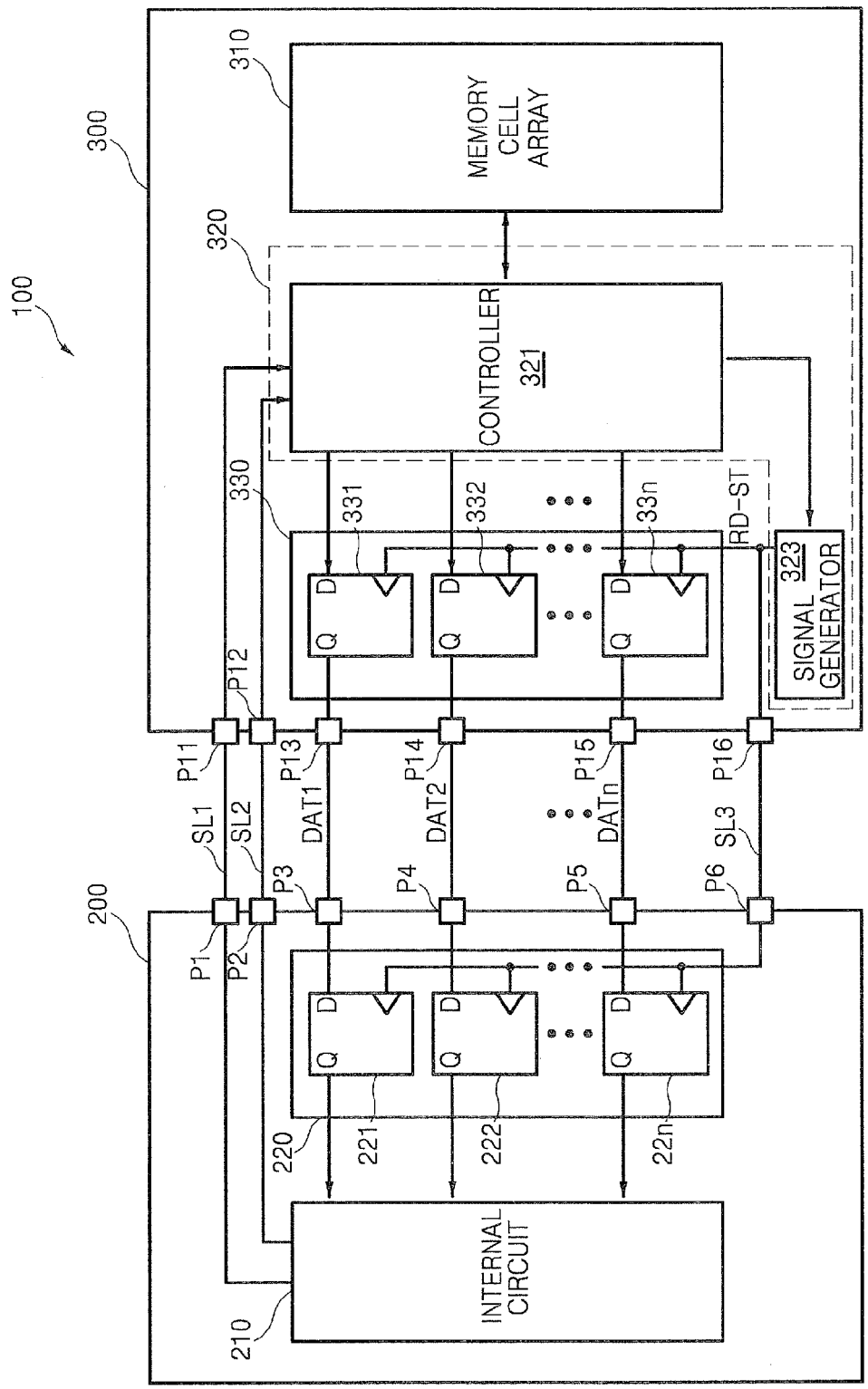
FIG. 2 is a block diagram of a system including a memory controller and a non-volatile memory device according to some embodiments of the present invention.

FIG. 2 is a block diagram of a system 100 including a memory controller and a non-volatile memory device according to some embodiments of the present invention. Referring to FIG. 2, in some embodiments, the system 100 may be a memory card, which can be used in digital still cameras, video cameras, TV sets, audio systems, electronic musical devices, mobile phones, personal digital assistants (PDAs), personal computers (PCs), and/or voice recorders. Thus, when each of the digital still cameras, video cameras, TV sets, audio systems, electronic musical devices, mobile phones, PDAs, PCs, and/or voice recorders is equipped with an interface (not shown) and a slot (not shown) connected to the interface, the system 100 may be connected to the slot to exchange predetermined data and commands with a CPU and/or microprocessor of each of the digital still cameras, video cameras, TV sets, audio systems, electronic musical devices, mobile phones, PDAs, PCs, and/or voice recorders, through the interface.

As shown in FIG. 2, the system 100 includes a memory controller 200, a non-volatile memory device 300, and a plurality of signal transmission lines SL1, SL2, DAT1, DAT2, ..., DATn, and SL3 for transmitting commands and data between the memory controller 200 and the non-volatile signal memory device 300. The signal transmission lines DAT1, DAT2, ..., DATn can perform a function of a data bus (I/Ox of FIG. 3 or 6) for transmitting a command (for example, a write command and/or a read command), an address (for example, a write address and/or a read address), and/or data (for example, write data and/or read data).

The memory controller 200 is configured to control the operations of the non-volatile memory device 300, such as read and/or write operations. For example, the memory controller 200 can control transmission of the write command and/or write data that is output from a host (not shown; for example, the CPU or microprocessor of the digital still cameras, video cameras, TV sets, audio systems, electronic musical devices, mobile phones, PDAs, PCs, and/or voice recorders) to the non-volatile memory device 300. In addition, the memory controller 200 may be configured to control reading data corresponding to a read address from the non-volatile memory device 300 in response to the read command and/or a read address and transmitting the read data to the host.

Figure 3:
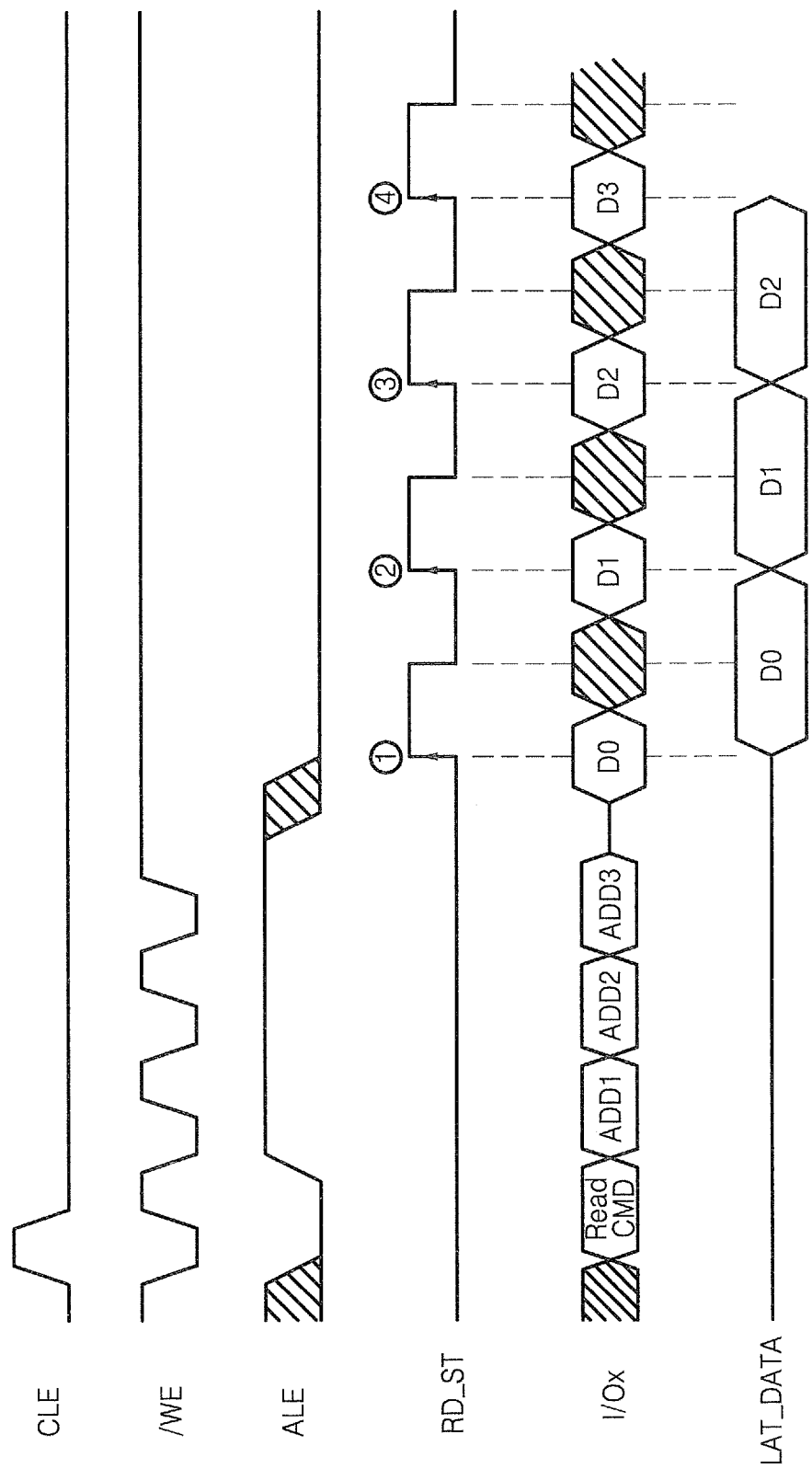
FIG. 3 is a timing diagram illustrating data during a read operation in the system of FIG. 2 according to some embodiments of the present invention.
Figure 6:
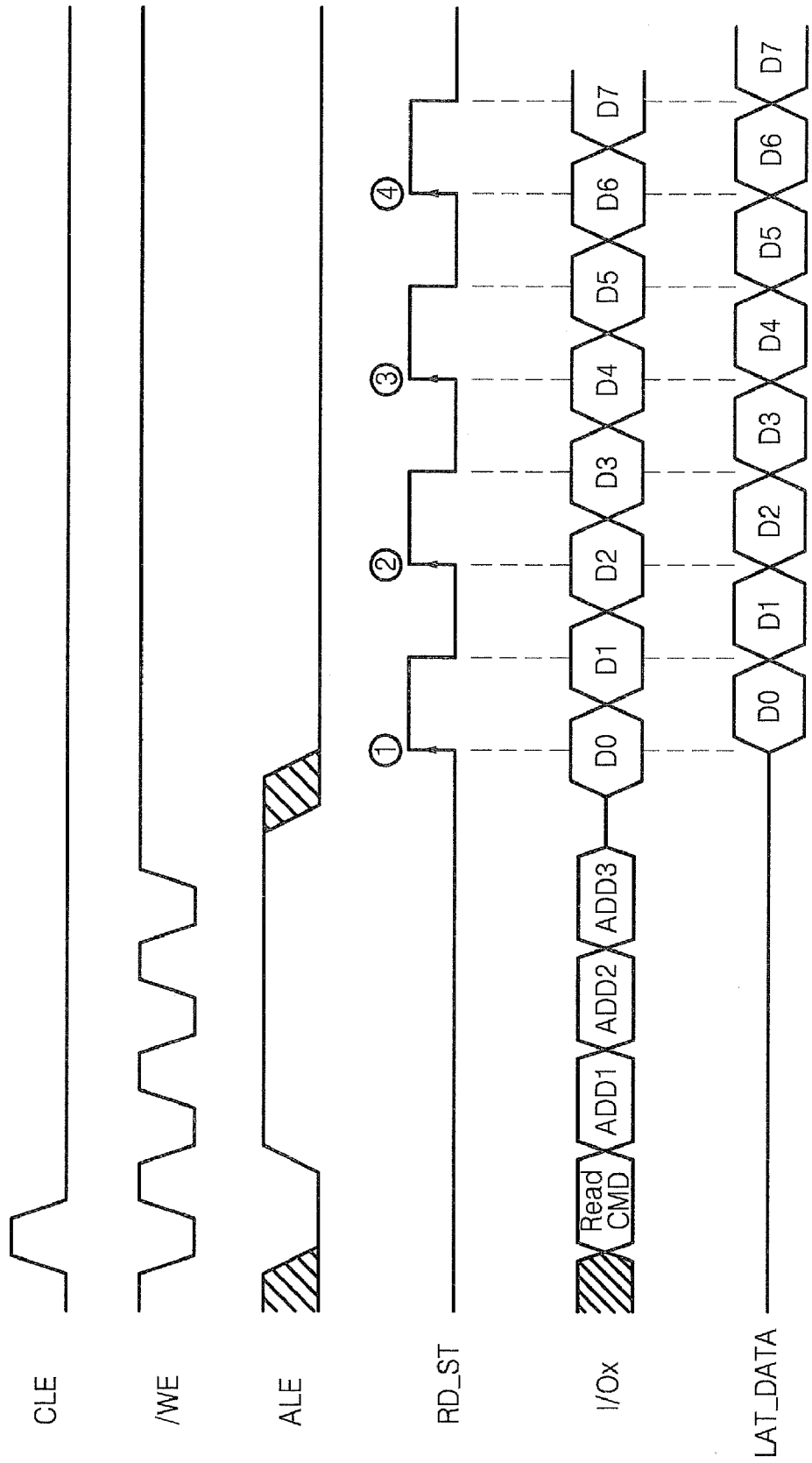
FIG. 6 is a timing diagram illustrating data during a read operation in the system of FIG. 5 according to some embodiments of the present invention.

The memory controller 200 includes an internal circuit 210 and a latch unit 220. As shown in FIGS. 3 and 6, during the read operation, the internal circuit 210 generates a read command Read CMD and read addresses ADD1 through ADD3, and outputs the generated read command and address to the non-volatile memory device 300 through the signal transmission lines DAT1 through DATN corresponding to pins P3 through P5 and P13 through P15 corresponding to the read command and address.

Referring to FIGS. 2 and 3, a command latch enable signal CLE generated by the internal circuit 210 can be output to the non-volatile memory device 300 through the pins P1 and P11 and the signal transmission line SL1. For example, when the command latch enable signal CLE has a logic "high" level, the read command Read CMD generated by the internal circuit 210 can be output to the non-volatile memory device 300 through the signal transmission lines DAT1 through DATn constituting the data bus I/Ox in response to a rising edge of a write enable signal /WE.

Also, an address latch enable signal ALE can be output to the non-volatile memory device 300 through the pins P2 and P12 and the signal transmission line SL2. For example, when the address latch enable signal ALE has a "high" level, the read addresses ADD1 through ADD3 generated by the internal circuit 210 can be output to the non-volatile memory device 300 through the signal transmission lines DAT1 through DATN constituting the data bus I/Ox in response to a rising edge of a write enable signal /WE.

The respective pins P1 through P6 and P11 through P16 can be connected to each other through trace on the PCB and/or the signal transmission lines SL1, SL2, DAT1, DAT2, . . . , DATN, and SL3 of a cable. Also, according to some embodiments, the memory controller 200 can receive the read command Read CMD and read addresses ADD1 through ADD3 output from the CPU or microprocessor of the host (for example, digital still cameras, video cameras, TV sets, audio systems, electronic musical devices, mobile phones, PDAs, PCs, and/or voice recorders), and output the read command Read CMD and read addresses ADD1 through ADD3 to the non-volatile memory device 300 through the pins P3 through P5 and P13 through P15 corresponding thereto and the signal transmission lines DAT1, DAT2, . . . , DATn corresponding thereto.

During the read operation, the latch unit 220 can latch data D0 through D2 output from the non-volatile memory device 300 in response to a data strobe signal RD-ST received from the non-volatile memory device 300 through the signal transmission line SL3, and can output the latched data LAT_DATA to the internal circuit 210. Thus, the internal circuit 210 can process the data LAT_DATA output from the latch unit 220 and/or transmit the data LAT_DATA to the host.

As shown in FIG. 2, the latch unit 220 includes a plurality of flip-flops 221, 222, . . . , 22n, where n is a natural number. As shown in FIG. 2, each of the flip-flops 221, 222, . . . , 22n can latch the data output from the non-volatile memory device 300 in response to a rising edge of a data strobe signal RD_ST.

Figure 5:
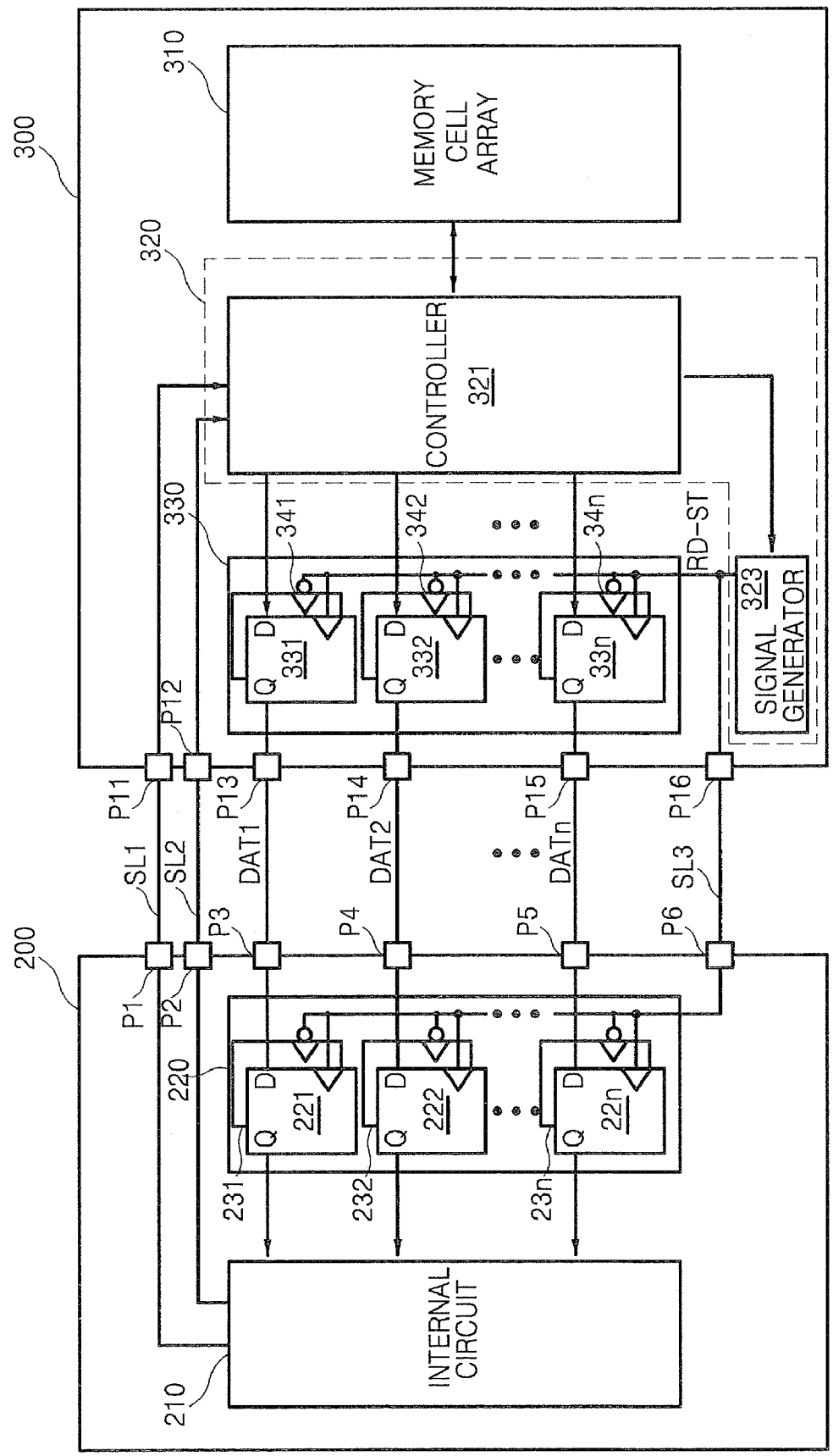
FIG. 5 is a block diagram of a system including a memory controller and a non-volatile memory device according to some embodiments of the present invention.

Also, as shown in FIG. 5, the latch unit 220 includes a plurality of first flip-flops 221, 222, . . . , 22n and a plurality of second flip-flops 231, 232, . . . , 23n. Each of the first flip-flops 221, 222, . . . , 22n may be configured to process the data output from the non-volatile memory device 300 and/or output the data to the host in response to the rising edge of the data strobe signal RD_ST. Each of the second flip-flops 231, 232, . . . , 23n may be configured to process the data output from the non-volatile memory device 300 and/or output the data to the host in response to the falling edge of the data strobe signal RD_ST.

Referring to FIGS. 2 and 5, the non-volatile memory device 300 includes a memory cell array 310, a control unit 320, and a latch unit 330. The memory cell array 310 may include a plurality of memory cells arranged in a matrix pattern (i.e., including a plurality of columns and rows). Each of the memory cells may be a flash EEPROM (flash electrically erasable programmable read-only memory), and the flash EEPROM may be an SLC (single level cell) or MLC (multi-level cell).

The control unit 320 is configured to control receiving the read command Read CMD and read addresses ADD1 through ADD3 output from the memory controller 200, generating the data strobe signal RD_ST based on the received read command Read CMD, reading data corresponding to the received read addresses ADD1 through ADD3 from the memory cell array 310, and outputting the read data to the latch unit 330.

The control unit 320 includes a controller 321 and a signal generator 323. The controller 321 receives the read command Read CMD and read addresses ADD1 through ADD3 and generates a control signal based on the received read command Read CMD. The controller 321 controls reading of the data corresponding to the received read addresses ADD1 through ADD3 from the memory cell array 310 and outputting of the read data to the latch unit 330.

The signal generator 323 generates the data strobe signal RD_ST to latch data in response to the control signal output from the controller 321. The generated data strobe signal RD_ST is output to the latch unit 330, and also to the latch unit 220 of the memory controller 200 through the pins P6 and P16 corresponding thereto and the transmission line SL3.

The latch unit 330 latches the data output from the control unit 320 in response to the data strobe signal RD_ST generated by the signal generator 323. As shown in FIG. 2, the latch unit 330 may include a plurality of flip-flops 331, 332, . . . , 33n. In this case, each of the flip-flops 331, 332, . . . , 33n can latch the data output from the control unit 320 in response to the rising edge of the data strobe signal RD_ST.

Also, as shown in FIG. 5, the latch unit 330 may include a plurality of third flip-flops 331, 332, . . . , 33n and a plurality of fourth flip-flops 341, 342, . . . , 34n. Each of the third flip-flops 331, 332, . . . , 33n may be configured to process (latch or output) the data output from the control unit 320 in response to the rising edge of the data strobe signal RD_ST. Each of the fourth flip-flops 341, 342, . . . , 34n may be configured to process (latch or output) the data output from the control unit 320 in response to the falling edge of the data strobe signal RD_ST.

Thus, the latched data is output to the latch unit 220 of the memory controller 200 through the pins P3 and P13, P4 and P14, . . . , P5, and P15 and the signal transmission lines DAT1, DAT2, . . . , DATn. That is, as shown in FIGS. 5 and 6, each latch unit 220 and/or 330 may be configured to process data in response to both rising and falling edges of the data strobe signal RD_ST.

FIG. 3 is a timing diagram illustrating a read operation in the system of FIG. 2. Referring to FIGS. 2 and 3, during the read operation, in response to the rising edge (①) of the data strobe signal RD_ST, data D0 output from the latch unit 330 is latched by the latch unit 220 that responds to the rising edge (①) of the data strobe signal RD_ST. That is, the memory controller 200 is configured to latch each data signal output from the non-volatile memory device 300, for example, each data signal D0 through D7 on the data bus I/Ox, within a cycle (or period) of the strobe signal RD_ST. Here, "LAT_DATA" indicates each data signal D0 through D2 output from the latch unit 220 of the memory controller 200 to the internal circuit 210. Accordingly, the memory controller 200 may be configured to perform the 1-cycle access even when the read cycle time tRC is decreased.

Therefore, the non-volatile memory device 300 according to some embodiments of the present invention and/or the system 100 including the non-volatile memory device 300 according to some embodiments of the present invention may be configured to reduce and/or eliminate problems associated with data set-up time and data hold time. For example, the non-volatile memory device 300 and/or the system 100 including the non-volatile memory device 300 may be configured to sufficiently secure the data set-up time margin and data hold time margin that are generated when the data is read from the non-volatile memory device 300 during the read operation. Also, the non-volatile memory device 300 and/or the system 100 including the non-volatile memory device 300 may be configured to reduce and/or eliminate the skew and/or data output delay time of the data strobe signal RD_ST when the write enable signal /WE synchronized with the data strobe signal RD_ST is used.

Figure 4:
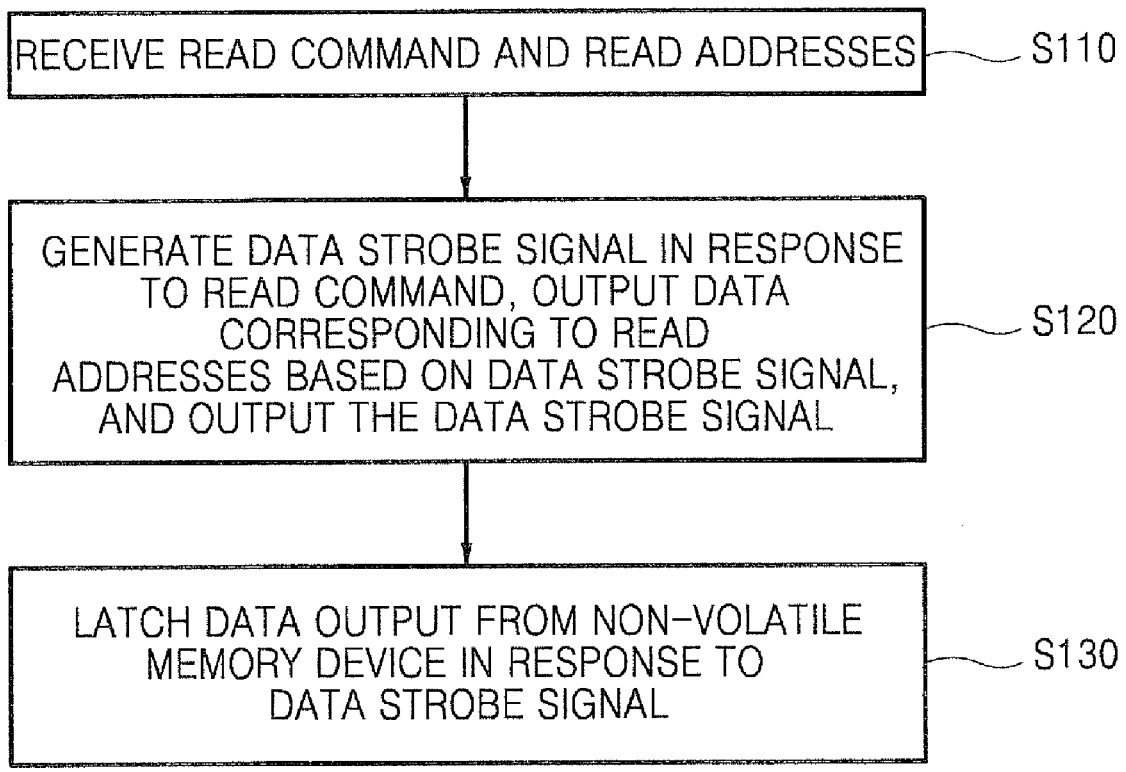
FIG. 4 is a flow chart illustrating data processing methods according to some embodiments of the present invention.

FIG. 4 is a flowchart illustrating data processing operations according to some embodiments of the present invention. Referring to FIGS. 2 and 4, in a data processing method according to some embodiments of the present invention, the non-volatile memory device 300 receives the read command Read CMD and read addresses ADD1 through ADD3 output from the memory controller 200 through the data bus I/Ox (S110).

The non-volatile memory device 300 generates the data strobe signal RD_ST in response to the received read command Read CMD, and outputs data corresponding to the read addresses ADD1 through ADD3 stored in the memory cell array 310 along with the data strobe signal RD_ST to the memory controller 200 in response to generating the data strobe signal RD_ST (S120). According to some embodiments, the non-volatile memory device 300 can generate the data strobe signal RD_ST synchronized with the write enable signal /WE. The memory controller 200 latches the data output from the non-volatile memory device 300 in response to the received data strobe signal RD_ST (S130).

As described above, in a non-volatile memory device according to some embodiments of the present invention configured to generate a data strobe signal during a read operation, problems associated with data set-up time and/or data hold time that may occur when the data is read by the memory controller from the non-volatile memory device can be reduced and/or eliminated. That is, since the data set-up time margin and data hold time margin can be sufficiently secured regardless of the reduction in read cycle time, the performance of the read operation may be improved. Also, the non-volatile memory device according to some embodiments of the present invention configured to generate the data strobe signal during the read operation can reduce the skew and data output delay time of the data strobe signal.

While the present invention has been particularly shown and described with reference to preferred embodiments thereof, it will be understood by those skilled in the art that various changes in form and details may be made therein without departing from the spirit and scope of the invention as defined by the appended claims.

That which is claimed:

1. A method operating a non-volatile memory device, the method comprising:
   receiving a read command output from a memory controller;
   generating a data strobe signal to latch data responsive to receiving the read command; and
   outputting the latched data to the memory controller responsive to the generated data strobe signal and outputting the generated data strobe signal to the memory controller.

2. The method of claim 1, wherein the non-volatile memory device is a flash EEPROM.

3. A method for processing data between a non-volatile memory device and a memory controller, the method comprising:
   receiving a read command and a read address output from the memory controller at the non-volatile memory device;
   generating a data strobe signal responsive to the received read command;
   latching data corresponding to the read address from a non-volatile memory cell array to the memory controller responsive to the generated data strobe signal; and
   outputting the data strobe signal and the latched data to the memory controller responsive to the generated data strobe signal.

4. The method of claim 3, wherein outputting the data strobe signal and the latched data to the memory controller comprises:
   generating the data strobe signal at a control unit of the non-volatile memory device in response to the received read command and outputting the generated data strobe signal to the memory controller;
   reading the data corresponding to the read address from the non-volatile memory cell array at the control unit and outputting the data to a latch unit of the non-volatile memory device; and
   latching the data output from the control unit at the latch unit of the non-volatile memory device and outputting the latched data to the memory controller.

5. The method of claim 4, further comprising:
   latching the data output from the non-volatile memory device at a latch of the memory controller in response to the data strobe signal at the memory controller.

6. The method of claim 4, further comprising:
   latching the data corresponding to the read address at a latch of the memory controller in response to the data strobe signal and within a cycle of the data strobe signal after the data corresponding to the read address and the data strobe signal are output from the non-volatile memory device.

7. The method of claim 6, wherein latching the data comprises:
   latching the data at the latch of the memory controller responsive to a rising edge of the data strobe signal within the cycle of the data strobe signal.

8. The method of claim 6, wherein latching the data comprises:
   latching the data at the latch of the memory controller responsive to a falling edge of the data strobe signal within the cycle of the data strobe signal.

9. A non-volatile memory device comprising:
a latch unit
a non-volatile memory cell array configured to store data; and
a control unit configured to receive a read command and a read address output from a memory controller, generate a data strobe signal based on the received read command, read data corresponding to the received read address from the non-volatile memory cell array, output the read data to the latch unit, and output the data strobe signal to an external memory controller,
wherein the latch unit is configured to latch and output the data output from the control unit to the memory controller in response to the data strobe signal.

10. The non-volatile memory device of claim 9, wherein the non-volatile memory cell array is a flash EEPROM.

11. The non-volatile memory device of claim 9, wherein the latch unit comprises a plurality of flip-flops, and wherein the plurality of flip-flops are configured to latch the data output from the control unit and output the latched data to the memory controller in response to the data strobe signal.

12. The non-volatile memory device of claim 9, further comprising:
an output pin,
wherein the control unit is configured to output the data strobe signal to the memory controller via the output pin.

13. The non-volatile memory device of claim 9, wherein the control unit comprises:
a controller configured to receive the read command and the read address, generate a control signal based on the received read command, read the data corresponding to the received read address from the non-volatile memory cell array, and output the read data to the latch unit; and
a signal generator configured to generate the data strobe signal in response to the control signal.

14. A memory system, comprising:
a memory controller; and
a non-volatile memory device, wherein the non-volatile memory device comprises:
a first latch unit;
a non-volatile memory cell array configured to store data; and
a control unit configured to receive a read command and a read address output from the memory controller, generate a data strobe signal based on the received read command, read data corresponding to the received read address from the non-volatile memory cell array, and output the read data to the first latch unit,
wherein the first latch unit is configured to output the data output from the control unit to the memory controller in response to the data strobe signal, and wherein the control unit is configured to output the data strobe signal to the memory controller.

15. The memory system of claim 14, wherein the non-volatile cell array is a flash EEPROM.

16. The memory system of claim 14, wherein the first latch unit comprises a plurality of flip-flops, and wherein the plurality of flip-flops are configured to latch the data output from the control unit and output the latched data to the memory controller in response to the data strobe signal.

17. The memory system of claim 14, wherein the control unit comprises:
a controller configured to receive the read command and the read address, generate a control signal based on the received read command, read the data corresponding to the received read address from the non-volatile memory cell array, and output the read data to the first latch unit; and
a signal generator configured to generate the data strobe signal in response to the control signal.

18. The memory system of claim 14, wherein the memory controller comprises:
an internal circuit configured to output the read command and the read address; and
a second latch unit configured to receive the data output from the first latch unit in response to the data strobe signal output from the control unit of the non-volatile memory device.

19. The memory system of claim 18, wherein the second latch unit comprises a plurality of flip-flops, and wherein the plurality of flip-flops of the second latch unit are configured to latch the data output from the first latch unit in response to the data strobe signal.

20. The memory system of claim 19, wherein the plurality of flip-flops of the second latch unit are configured to latch the data output from the first latch unit within a cycle of the data strobe signal.

21. The memory system of claim 20, wherein the plurality of flip-flops of the second latch unit are configured to latch the data responsive to a rising edge of the data strobe signal within the cycle of the data strobe signal.

22. The memory system of claim 20, wherein the plurality of flip-flops of the second latch unit are configured to latch the data responsive to a falling edge of the data strobe signal within the cycle of the data strobe signal.

23. The memory system of claim 14, wherein the memory system comprises a memory card.

* * * * *